(12) United States Patent
Toyoda et al.

(10) Patent No.: US 8,508,894 B2
(45) Date of Patent: Aug. 13, 2013

(54) SUSTAINED-ARC CONTROL SYSTEM ON SOLAR BATTERY ARRAY

(75) Inventors: Kazuhiro Toyoda, Fukuoka (JP); Meng Cho, Fukuoka (JP); Hikaru Kayano, Fukuoka (JP)

(73) Assignee: Kyusyu Institute of Technology, Fukuoka (JP)

( * ) Notice: Subject to any disclaimer, the term of this patent is extended or adjusted under 35 U.S.C. 154(b) by 133 days.

(21) Appl. No.: 13/128,111

(22) PCT Filed: Nov. 11, 2009

(86) PCT No.: PCT/JP2009/006016
§ 371 (c)(1),
(2), (4) Date: May 6, 2011

(87) PCT Pub. No.: WO2010/055649
PCT Pub. Date: May 20, 2010

(65) Prior Publication Data
US 2011/0216462 A1 Sep. 8, 2011

(30) Foreign Application Priority Data
Nov. 12, 2008 (JP) ................... 2008-289619

(51) Int. Cl.
*H02H 9/00* (2006.01)
(52) U.S. Cl.
USPC .......................................................... 361/56
(58) Field of Classification Search
USPC .......................................................... 361/56
See application file for complete search history.

(56) References Cited

U.S. PATENT DOCUMENTS

| 4,434,396 | A  | * | 2/1984  | Montague ........................ 323/230 |
|-----------|----|---|---------|------------------------------------------|
| 5,594,325 | A  | * | 1/1997  | Manner ........................... 323/282 |
| 5,986,354 | A  | * | 11/1999 | Nagao et al. ....................... 307/64 |
| 6,243,243 | B1 | * | 6/2001  | Gelderloos et al. ............... 361/56 |
| 6,248,950 | B1 | * | 6/2001  | Hoeber et al. ................... 136/251 |
| 7,082,019 | B2 | * | 7/2006  | Bodeau et al. .................... 361/82 |
| 7,586,770 | B2 | * | 9/2009  | Toba et al. ........................ 363/97 |
| 7,786,375 | B2 | * | 8/2010  | Swanson et al. ................ 136/252 |
| 2004/0085692 | A1 | * | 5/2004 | Bodeau et al. .................... 361/82 |
| 2007/0273339 | A1 | * | 11/2007 | Haines ........................... 323/223 |
| 2007/0291522 | A1 | * | 12/2007 | Toba et al. ....................... 363/132 |
| 2008/0147335 | A1 | * | 6/2008  | Adest et al. ....................... 702/64 |
| 2010/0163093 | A1 | * | 7/2010  | Boulanger et al. ............. 136/244 |

FOREIGN PATENT DOCUMENTS

| JP | 05-030656    | A  | 2/1993  |
|----|--------------|----|---------|
| JP | 05-122866    | A  | 5/1993  |
| JP | 2006-173539  | A  | 6/2006  |
| WO | 2004/010556  | A2 | 1/2004  |

* cited by examiner

*Primary Examiner* — Ronald W Leja
(74) *Attorney, Agent, or Firm* — Browdy and Neimark, PLLC

(57) ABSTRACT

A sustained-arc control system is constituted with a capacitance which is placed between a gap on a solar battery array, working to control or inhibit the sustained arc. A solar battery array has a plurality of solar cells to provide a power source onboard an artificial satellite. A plurality of series circuits each of which composed of the solar cells connected in series is connected in parallel. The sustained-arc control system on the solar battery array is constituted with a capacitance lying between a positive line and a negative line to be charged with a voltage oscillation arising from the sustained arc. Electrostatic capacity of the capacitance is in a range of from at least 33 nF to 10 μF.

1 Claim, 6 Drawing Sheets

SUSTAINED-ARC CONTROL SYSTEM ON SOLAR BATTERY ARRAY

FIELD OF THE INVENTION

The present invention relates generally to a system for controlling or inhibiting sustained discharge or arc on a solar battery array onboard, for example, an artificial satellite.

BACKGROUND OF THE INVENTION

On board the artificial satellites in recent years is an electric power source of solar battery array composed of a plurality of solar cells connected in series with each other. Most electric power needed in the artificial satellite is usually generated in the solar cell array. The electric power to be consumed in the artificial satellite has a tendency to become higher every year and correspondingly the satellite demands the high-power generators which are able to create the generated output above 100V. In existing situations, the artificial satellites become increasingly great in scale or dimension as seen in spacecrafts or spaceships and space stations and, as size increases, the solar cell modules or arrays need to be higher in electric potential.

The electric discharge or arc is normally caused by any potential difference which might occur between an insulator such as a cover glass or the like and a conductor such as spacecraft body and so on because of the interaction with the surrounding environment including substream, plasma and so on.

The single-discharge on the solar battery array, called primary arc, gives rise to not only degradation of the solar cells but malfunction of the onboard instruments. The discharge energy in the primary arc is traced to the energy of electric charges built up between the spacecraft body and the cover glass. A further difficult problem resides in a phenomenon that the discharge energy just after the primary arc on the solar battery array would cause short-circuit between the solar cells across which high potential difference exists. This short-circuiting phenomenon is called the secondary arc or sustained arc or discharge (SA). As the short-circuit current occurring during the sustained arc is continued getting fed from the solar battery array in generation, the output of the circuit would be lost in between the sustained arc.

Now referring to FIG. 9, there is shown a conventional solar battery array 3 carried on the artificial satellite 4. The prior solar battery array 3 has a series circuit 2 in which solar cells 1 are connected in series with one another and a gap 8 exists between a positive-side line 5 and a negative-side line 6. Inside the artificial satellite 4, there are electric circuits 13 to energize various instruments onboard the satellite 4. With the solar battery array 3 constructed as stated earlier, arrows indicate a path for electric current which could flow through after a sustained discharge or arc (SA) has occurred at the gap 8. The sustained discharge or arc (SA) having occurred in the solar battery array 3 accompanies intense light and overheating which, if worst comes to worst, could do fatal damage in which the solar cells would lose forever the ability of generating electricity.

The arcs or discharges occurring on the solar battery array 3 onboard the artificial satellite 4 are classified into four categories using their waveforms: a primary arc (PA) displaying a waveform as shown in FIG. 10 (A), and secondary arcs or sustained arcs (SA) having waveforms as in FIGS. 10 (B), (C), and (D). Moreover, the secondary arcs include a non-sustained arc (NSA) as in FIG. 10 (B), a temporary sustained arc (TSA) as in FIG. 10 (C) and a permanent sustained arc (PSA) as in FIG. 10 (D). The non-sustained arc (NSA) refers to a discharge in which the discharge current continues flowing only during the primary arc (PA). With the temporary sustained arc (TSA), the discharge current remains flowing after the primary arc current has ceased flowing, but soon disappears. The permanent sustained arc (PSA), unlike the temporary sustained arc (TSA), refers to a discharge where the discharge current continues flowing forever. Sign Ist in FIG. 10 shows an electric current flowing at the time of short circuiting. Conditions the sustained arc (SA) occurs vary depending on a gap length lying between the solar cells 1, a generated potential (Vst), the current (Ist) flowing through the solar cells 1, magnitude of the primary arc (PA) and so on. The existing technique to control or inhibit the sustained arc is to fill in all the gaps 8 with room-temperature-curing (RTV) silicone sealant to prevent the occurrence of electric potential difference.

Meanwhile, there has been conventionally known a power system onboard artificial satellite having a power supply having solar battery or solar cell array. The prior power system onboard artificial satellites, as disclosed in, for example patent document 1 enumerated later, has solar cells, and super-capacitors which are used to store the solar-generated energy and then power any loads as solar-generated energy are reduced. The super-capacitors are connected in parallel with Zener diodes to keep an upper limit for an output voltage to the loads. The solar cells charge the super-capacitors while powering the loads through the terminals. As the solar cells cease generating electricity after having gone into the shade, the super-capacitors start to discharge the stored solar-generated energy.

Moreover, the patent document 2 listed later discloses a bus voltage regulator used in the power source for the cosmonautic vehicle such as the artificial satellite and so on. The prior bus voltage regulator has a voltage regulator monitoring the solar-generated energy that is not needed immediately, based on a voltage value on a buss line through which the solar-generated power is applied to loads of instruments onboard the artificial satellite, and a circuit to shunt the solar-generated power in response to the voltage regulator. The voltage regulator further includes a shunt resistance connected in parallel with a load to regulate the bus voltage, and a switch to break the shunt-circuit to operate the solar cells with high efficiency.

REFERENCES CITED HERE

The patent documents 1 and 2 stated earlier refer to the following material information.
Patent document 1: Japanese Laid-Open Patent Application No. H05-30 656
Patent document 2: Japanese Laid-Open Patent Application No. H05-122 866

DISCLOSURE OF THE INVENTION

Technical Problems to be Challenged

A major problem faced in the solar battery array onboard the artificial satellite is discharge accidents which occur frequently on the solar battery arrays with an increase in satellite dimension as well as in desired high-voltage in the satellite. Advanced solar battery arrays, especially, are apt to give rise to the sustained arc in which the discharge is sustained with the short-circuit current caused by the solar-generated power itself of high voltage. As a result of the sustained discharge, operation of the satellite if worst comes to worst, would be impossible. The sustained arc, because of the possibility of getting into the satellite accident as stated earlier, has to be inhibited or controlled appropriately. Thus, it remains a major challenge to develop a method or system making it possible to inhibit or control the sustained discharge or arc on the solar battery array onboard the artificial satellite.

One of the prior art to control or inhibit the sustained arc as stated earlier is to fill in all the gaps lying between solar cells with room-temperature-curing (RTV) silicone sealant to prevent the occurrence of electrical potential difference. Yet this prior technique often creates a diversity of issues, which includes making the solar battery array heavier in weight, or giving rise of introduction of degradation caused by thermal cycle, costly production requirements, less power generation efficiency because of occurrence of contamination and so on. Corrosion of insulating resin stemming from thermal cycle in space environment, moreover, raises triple junctions which have a potential for creating the sustained arc. Consequently, it will be preferred to rather refrain from filling in all the gaps lying between solar cells with room-temperature-curing (RTV) silicone sealant.

The present invention has as its principal object overcoming the problems as set forth above. In view of the above problems associated with the most related prior art that the room-temperature-curing (RTV) silicone sealant is applied to the solar battery array onboard the artificial satellite sent into space to fill all the gaps between the solar cells which are vulnerable to plasma environment and more likely to create potential difference, the present invention provides a system to control or inhibit a sustained arc or discharge on a solar battery array, in which a capacitance is placed between a positive side and a negative side of solar battery array. With the system constructed as stated earlier, as the capacitance is charged with a voltage oscillation coming from the sustained arc, the current fed to the sustained arc goes away. As a result, the duration of the sustained arc is shortened or decays and eventually the sustained arc leads to extinction. Thus, the sustained-arc control system of the present invention is expected to keep the solar battery array in good performance. Moreover, this system of the present invention contributes to weight reduction of the solar battery array. More particularly, after the sustained arc has occurred on the solar battery array having the capacitance built in between the solar cells, a short circuit occurs under the influence of arc plasma across the gap lying between the solar cells. Meanwhile, the arc current and voltage across the gap consists of a direct-current component and a high-frequency component. As the arc plasma density becomes faded or thinner, the arc current gets lowered and the arc voltage across the gap recovers. The restoration of the voltage across the gap inspires an increase of the arc plasma density. As a result, the voltage across the gap falls to a level of the arc voltage while the arc current inversely starts increasing to have the high-frequency component. Repetition of the cycle as stated above till extinction of arc results in suppression or inhibition of the sustained arc.

Means to Overcome Problems

The present invention pertains to a solar battery array serving as an electric power source in which series circuits each of which has a plurality of solar cells connected in series are connected through a positive line and a negative line to positive terminals and negative terminals of loads built in an artificial satellite and, more particular, it relates to a system for controlling or inhibiting the sustained arc on the solar battery array, in which a capacitance to be charged with voltage oscillation caused by a sustained discharge or arc is inserted between the positive line and the negative line of the series circuits or between preselected series circuits to control or inhibit the sustained arc.

The sustained-arc control system on the solar battery array according to the present invention is composed of a plurality of capacitance to control the sustained arc is placed in parallel between the positive terminals and negative terminals.

With the system constructed as stated earlier, as the capacitance is charged at the time of occurrence of the sustained arc, the current fed to the sustained arc goes away. As a result, the duration of the sustained arc is shortened or decays and eventually the sustained arc leads to extinction.

Moreover, an electrostatic capacity of the capacitance is determined best depending on the electric circuit system or the electric generating capacity on the solar battery array. It is preferred that the electrostatic capacity of the capacitance is in the range of from at least 33 nF to 10 µF.

Advantageous Effects of the Invention

The system for controlling or inhibiting the sustained arc on the solar cell array of the present invention, as stated earlier, is constructed with the capacitances which are installed between the positive line and the negative line in, especially, the gaps which have the potential difference so high as more likely to cause the sustained arc on the solar battery array. With the system constructed as stated just above, after the sustained arc has occurred at the gaps nearby the capacitances, a short circuit occurs under the influence of arc plasma across the gap and the capacitances repeatedly suffer charge-and-discharge as the arc plasma density varies. Meanwhile, the cycle of high-frequency component is not done smoothly. As a result, the arc gets extinguished and suppression or inhibition of the sustained arc is attained.

DETAILED DESCRIPTION OF THE PREFERRED EMBODIMENT

Figure 1:
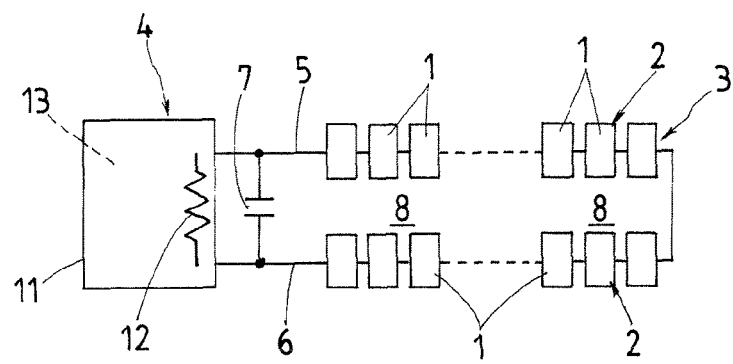
FIG. 1 is a schematic circuitry diagram to explain the basic principle of a sustained-arc control or inhibition on a solar battery array according to the present invention.
Figure 2:
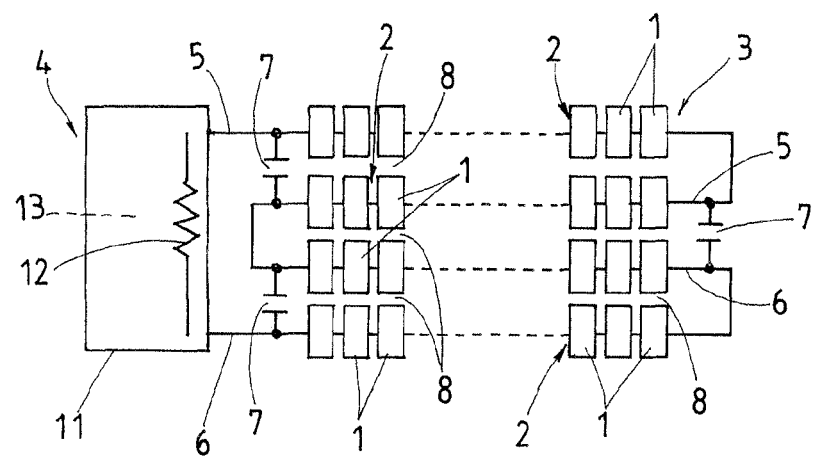
FIG. 2 is another schematic circuitry diagram to explain the basic principle of a sustained-arc control or inhibition on a solar battery array according to the present invention.
Figure 3:
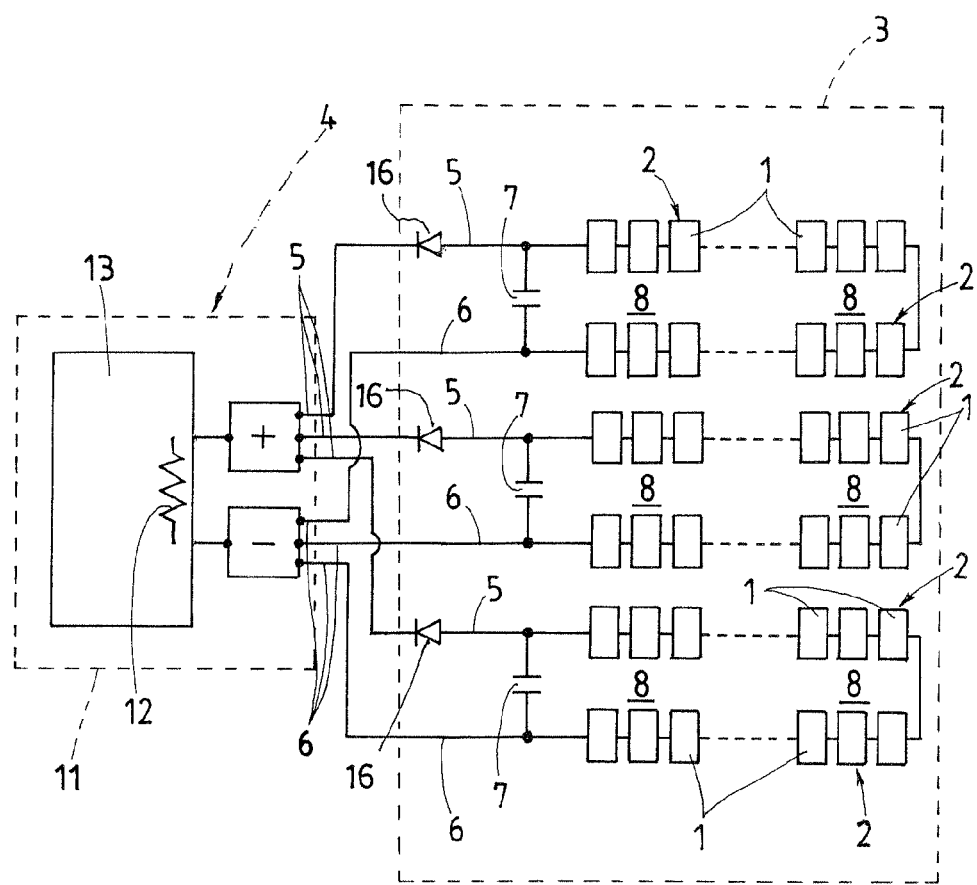
FIG. 3 is a schematic circuitry diagram showing a preferred embodiment of a system for controlling or inhibiting a sustained arc on a solar battery array constructed according to the present invention.

A preferred embodiment of a sustained-arc control system on a solar battery array according to the present invention will be described hereinafter with reference to the accompanying drawings. In FIGS. 1 and 2, there are shown the basic principle of the sustained-arc control system on the solar battery array according to the present invention. FIG. 3 shows a preferred embodiment of the sustained-arc control system on the solar battery array according to the present invention.

The system for controlling or inhibiting the sustained arc on the solar battery array constructed according to the present invention, as shown in FIGS. 1 and 2, is provided on a solar battery array 3 serving an electric source onboard an artificial satellite 4. With the solar battery array 3, plural series circuits 2 each of which has a plurality of solar cells 1 connected in series are connected in parallel with one another. The sustained-arc control system on the solar battery array of the present invention, especially, features that capacitance 7 to be charged with voltage oscillation caused by a sustained discharge or arc are inserted between a positive line 5 and a negative line 6 of the series circuits 2 to control or suppress the sustained arc. With the sustained-arc control system constructed as stated just above, after the sustained arc has occurred at a gap 8 nearby the capacitance 7, a short circuit occurs under the influence of arc plasma across the gap 8 and the capacitance or condenser 7 repeatedly suffers charge-and-discharge as the arc plasma density varies. Meanwhile, the cycle of high-frequency component is not done smoothly. As a result, the arc gets extinguished. As the sustained-arc control system on the solar battery array of the present invention works on the principle as stated earlier, the arc plasma short-circuiting across the gap 8 comes to extinction or gets extinguished prior to growing to a temporary sustained arc (TSA) or a permanent sustained arc (PSA).

The solar battery array 3 as seen in FIG. 3 is carried on the artificial satellite 4 and constituted with plural series circuits 2 each of which has a plurality of solar cells 1, the series circuits 2 being connected in series are connected in parallel with one another. The series circuit 2 is folded back midway between opposite terminals into the positive line 5 and the negative line 6 both of which are connected to an electric circuitry 13 onboard the artificial satellite 4. Outputs of the electric circuitry 13 are connected with a load 12 to energize various instruments. Especially, the sustained-arc control system on the solar battery array of the present invention is characterized by the capacitance 7 placed between and connected with the positive line 5 and the negative line 6. On the positive line 5, there is provided a diode 16 to control the direction of current flow. Upon occurrence of the sustained arc, the capacitance 7 is charged with the voltage oscillation arising from the sustained arc. As a result, the current fed to the sustained arc goes away. Then, the duration of the sustained arc is shortened or decays and eventually the sustained arc leads to extinction.

Figure 4:
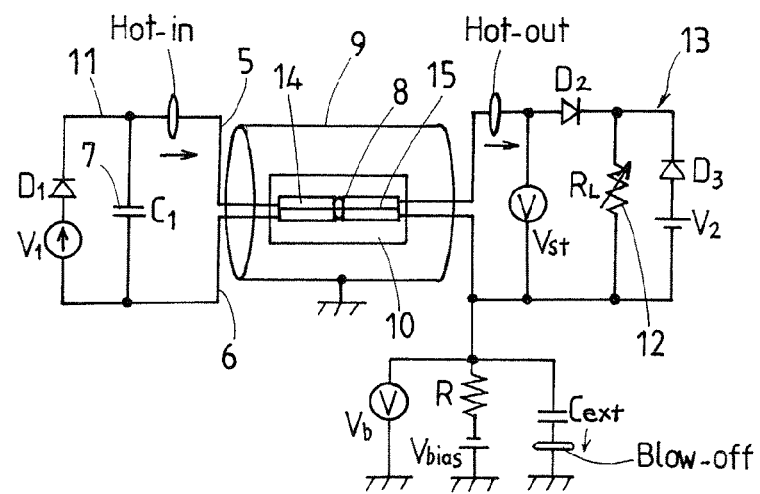
FIG. 4 is a circuitry diagram showing an experimental circuit to simulate the sustained-arc control to prove the working of the sustained-arc control system on the solar battery array according to present invention.

Ground-based tests were staged using an experimental circuit to prove the sustained-arc control system on the artificial satellite constructed according to the present invention. The experimental circuit had a cylindrical chamber 9 having a diameter of 1.0 m and a depth of 1.2 m. A plasma source of xenon gas was used to make a controlled simulation of space-plasma environment in the experimental circuit. The degree of vacuum inside the chamber 9 at the time of plasma ignition was $1 \times 10^{-2}$ Pa and the electron density was $1 \times 10^{12}/m^3$. The experimental circuit used an equivalent circuit as shown in FIG. 4 to make it possible to simulate a generation situation of the on the artificial satellite 4. In FIG. 4, there is shown a circuitry diagram of the experimental circuit with points to sense electric current and voltage. Power sources V1 and V2 were to simulate photovoltaic situation in the artificial satellite 4. Especially, the power sources V1 simulated the photovoltaic power of the solar battery array 3 and another V2 simulated stored energy or power in batteries carried on the satellite 4. Diodes D1 and D3 were to inhibit or the electric current from flowing into the power sources V1 and V2, respectively. Another diode D3 was to inhibit the electric current from flowing into an experimental sample 10. A capacitor C1 was a capacitance serving to control or suppress the sustained arc. A bias voltage Vbias simulated a potential difference related to edge plasma on the artificial satellite 4. A resistance R was used as a limiting resistor related to the bias voltage (Vbias). An external capacitor Cext was inserted to determine energy of the primary arc. Moreover, a variable resistor RL was to simulate a load 12 of the satellite body 11. On the circuit shown in FIG. 4, the generated potential Vst was 100V, the external capacitor Cext was set to 20 nF and the resistance R was 100KΩ. With the experimental circuit in FIG. 4, furthermore, the current Ist was 1.5 A, Sign "Hot" meant the voltage was high and sign "Blow off" represented the current was ordinarily blocked there, but allowed to flow through there at the moment the sustained arc occurred. A voltage Vb was the equivalent of circuitry to develop the atmosphere of plasma state in which + ions and − ions intermingled with one another.

Figure 5:
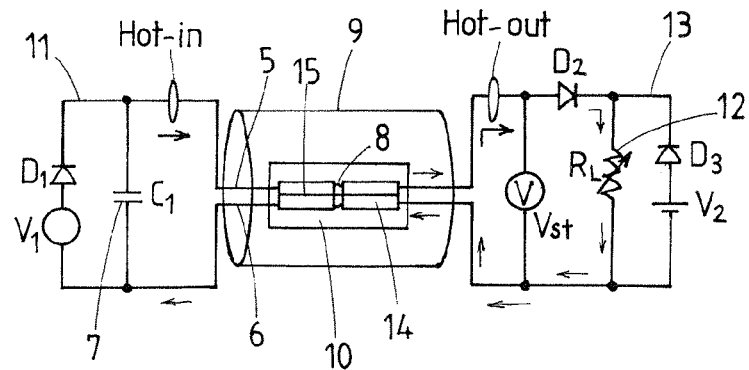
FIG. 5 is a circuitry diagram showing a path of current flow at a normal state where no sustained arc occurs in the circuitry shown in FIG. 4.
Figure 6:
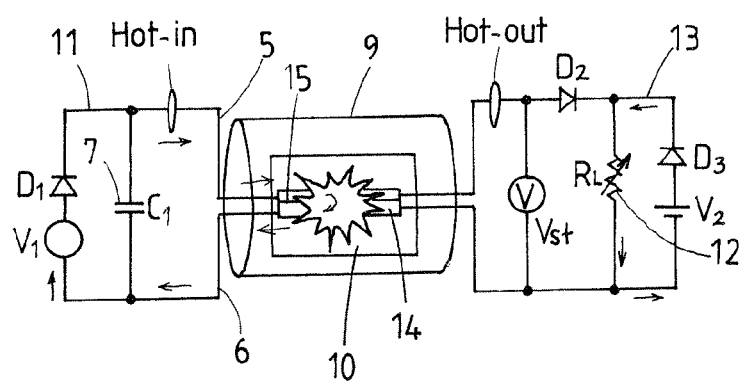
FIG. 6 is a circuitry diagram showing a path of current flow when the sustained arc exists in the circuitry shown in FIG. 4.

In FIG. 5, there are shown arrows to indicate a path for electric current which could flow ordinarily through when no sustained arc occurs on the experimental circuit to simulate the sustained-arc control system on the solar battery arrays. In contrast, FIG. 6 shows arrows to indicate a path for electric current which could flow after the sustained arc has occurred. With the experimental circuit under normal state, an electric current fed by the power source V1 compared to the solar cells 4 as shown in FIG. 5, after having flowed across the variable resistor RL compared to the load 12 on the artificial satellite body 11, went back to the power source V1. Upon occurrence of the sustained arc on the experimental circuit, the arc plasma caused a short-circuiting across the experimental sample 10. As the result, the electric current fed by the power source V1 as shown in FIG. 6 didn't flow across the variable resistor RL. Instead, the current from the power source V2 were applied across the load 12. With the experimental circuit, even when a short-circuiting occurred between any paired solar battery arrays, the current supply from other solar battery arrays was simulated. The experimental sample 10 used a cable of 1.1 mm (inclusive of a skin) with the skin of 0.15 mm in thickness.

Getting a core of conductive wires bare is a prerequisite to cause the short-circuiting at the cable 15 in the experimental circuit. Moreover, it is necessary to make the cables 5 connect with each other at their bare cores for occurrence of the sustained arc. To this end, the experimental sample was made with cables 15 whose coverings 14 were stripped off partially. The reason why the cable 15 was employed for the experimental sample 10 was that the cable, unlike the solar battery array 3, had no capacitance and reactance therein and therefore, was considered to be helpful in identifying simply operation of the capacitance 7 to control, inhibit or suppress the sustained arc.

The tests using this experimental circuit were conducted as changing the capacitance C1 into six different values: 0 nF, 11 nF, 33 nF, 50 nF, 100 nF and 470 nF. What the capacitance 0 nF meant there was no capacitance 7. A line-to line voltage or a line voltage (Vst) was kept at 100V while a line-to-line current or a line current Ist was maintained at 1.5 A throughout all the tests. The following table 1 shows the frequency (Arc-no) of primary arc PA, odds of developing from the primary arc PA into the non-sustained arc (NSA) or the temporary sustained arc (TSA), and average of sustained-arc duration with standard deviation every different capacitance.

TABLE 1

| Capacitance nF | Frequency of PA | NSA % | TSA % | Duration of SA μs |
|---|---|---|---|---|
| 0 | | PS occurred | | |
| 11 | | PS occurred | | |
| 33 | 60 | 85 | 15 | 100.6 ± 424.2 |
| 50 | 49 | 85.7 | 14.3 | 54.5 ± 267.6 |
| 100 | 35 | 100 | 0 | 2.6 ± 0.07 |
| 470 | 46 | 80.4 | 19.6 | 7.0 ± 3.3 |

As changing the capacitance C1 of the experimental circuit in increments as shown in table 1, the primary sustained arc occurred at 0 nF and 11 nF. Nevertheless, it was found that there was caused no primary sustained arc at 33 nF and more. Moreover, when the electrostatic capacity of the capacitance C1 increased up to 100 nF, odds of developing the temporary sustained arc (TSA) became 0% and, therefore, the TSA turned out to be controlled or inhibited. Thus, it had proved that the greater the electrostatic capacity of the capacitance C1 over a range of from 33 nF to 100 nF, the less the duration of the sustained arc. Comparing 100 nF with 470 nF, it was found that the electrostatic capacity of 470 nF was more in the duration of sustained arc and in the odds of developing the temporary sustained arc (TSA).

In view of the above in connection with the sustained-arc control system on the solar battery arrays, it was proved that the electrostatic capacity of the capacitor 7 could be determined to the optimal value depending on the circuitry system on the solar battery arrays and/or the generation capacity. According to the conditions carried out on the experimental circuit, the electrostatic capacity of the capacitor 7 was found to be, for example, in the range of from at least 33 nF to 470 nF, especially best at 100 nF. Nevertheless, the electrostatic capacity of the capacitor 7 will vary dependent on the circuitry arrangement of the series circuits 2 on the solar battery arrays, and the generated voltage and current. The range of from 33 nF to 10 μF has proved to be of practical use at commonly operating conditions on the solar battery arrays.

Figure 7:
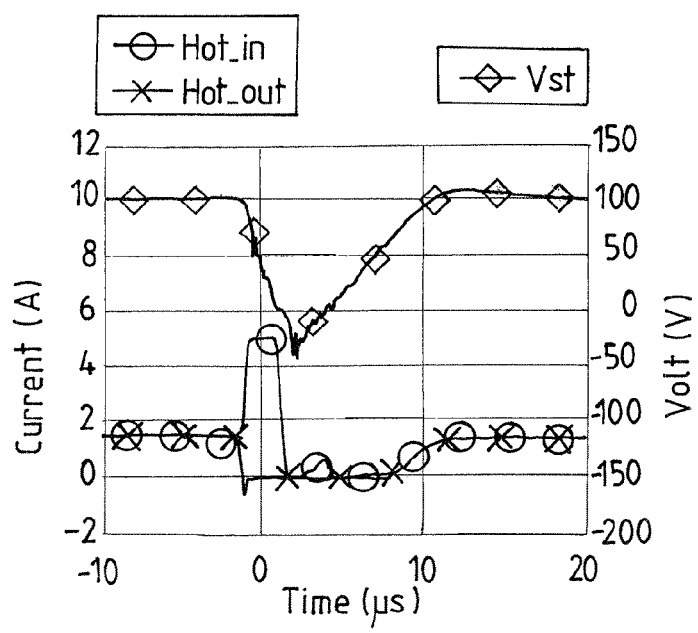
FIG. 7 is a graphic representation showing waveforms of the sustained arc given when a capacitance is 100 nF.

In FIG. 7, there is shown an example of the discharge waveforms at the capacitance C1 having the electrostatic capacity of 100 nF. A current probe used for the measurement, because of having no magnification in current value, couldn't measure the current value of 5 A and more as shown in FIG. 7. A difference between a Hot-in and a Hot-out referred to the arc current Ist, which was set to 1.5 A, Accordingly, the current value of 1.5 A and more on the Hot-in appeared during the capacitance C1 was discharging. In contrast, the current value less than 1.5 A on the Hot-in existed during the capacitance C1 was recharging.

As seen in FIG. 7, it was found that the voltage Vst fell just after the discharge began and the discharge of the capacitance C1 followed. The capacitance C1, after the completion of discharge, started to charge. The current Ist flowing into the arc has proved to be null or zero because the current flowing into the arc are entirely consumed in recharging of the capacitance C1. The sustained arc was considered disappeared or extinguished because the arc became unstable as the result of an inrush current on the capacitance C1 at the time of starting to discharge.

However, energy of the inrush current on the capacitance C1 increased as the electrostatic capacity of the capacitance C1 increased. And, the short-circuiting caused by the increased inrush energy resulted in formation of dense arc plasma. After having compared 100 nF and 470 nF of the capacitance C1, the odds of developing the non-sustained arc (NSA) had been thought to be more increased in 470 nF than in 100 nF of the capacitance C1, and then causing the increased duration of the sustained arc.

Figure 8:
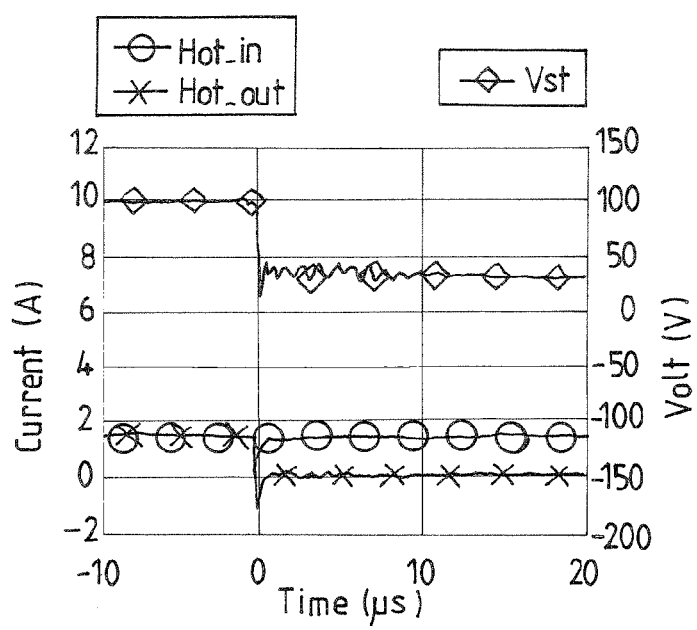
FIG. 8 is a graphic representation showing waveforms of the sustained arc given when a capacitance is 0 nF.
Figure 9:
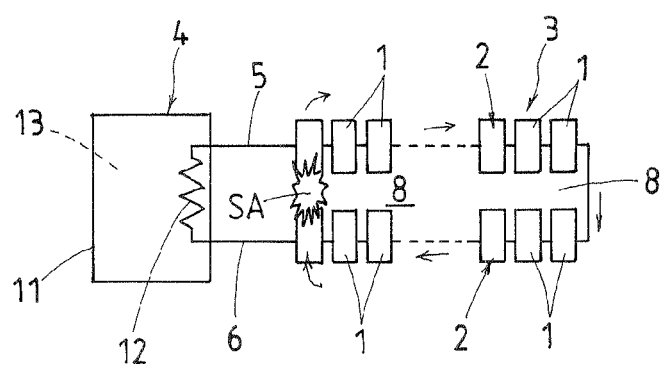
FIG. 9 is a schematic circuitry diagram to explain the basic principle on a prior solar battery array.
Figure 10:
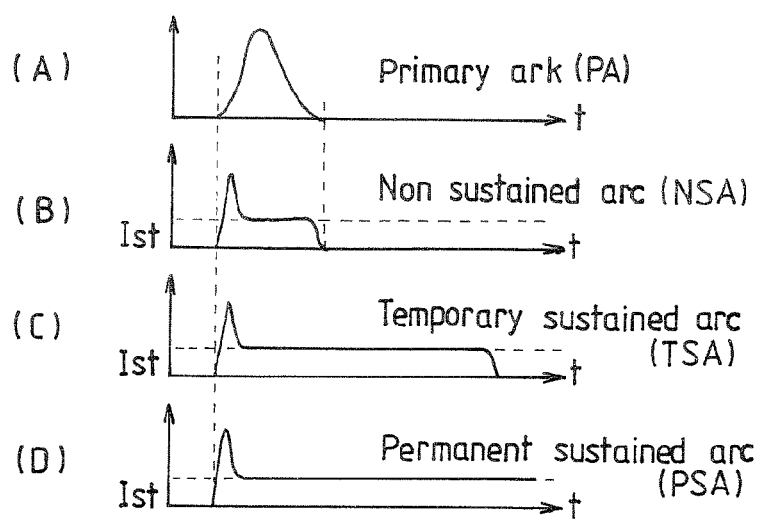
FIG. 10 is a graphic representation showing waveforms of different sustained arcs occurring on the solar battery array.

In FIG. 8, there is depicted one example of the arc waveforms obtained when the capacitance C1 had the electrostatic capacity of 0 nF. It is said what the capacitance C1 has the electrostatic capacity of 0 nF is comparable with a circuitry in which there is no capacitance C1 between the positive line 5 and the negative line 6. With the circuitry, there occurred the sustained arc PSA having the waveform as shown in FIG. 8. Thus, the capacitance C1=0 nF had proved caused less oscillation on the arc current and arc voltage, thereby getting the plasma stable.

With the sustained-arc control system of the present invention constructed as stated earlier, the capacitance connected between the positive line and negative line to control the sustained arc had proved effective in shortening or decaying the sustained-arc duration and thereby successful in controlling or inhibiting the permanent sustained arc (PSA) and the temporary sustained arc (TSA). Moreover, it could be confirmed that when the electrostatic capacity C1 of the capacitor 7 increased too much, the inrush current on the capacitor 7 caused the denser arc plasma, and there were some cases where the sustained-arc duration took too long.

INDUSTRIAL APPLICABILITY

The sustained-arc control system on the artificial satellite constructed according to the present invention has the industrial applications for the solar battery arrays onboard the spacecrafts flying across the universe, especially the artificial satellites.

| DESIGNATION OF CODE OR REFERENCE SIGN | |
|---|---|
| 1 | solar cell |
| 2 | series circuit |
| 3 | solar battery array |
| 4 | artificial satellite |
| 5 | positive line |
| 6 | negative line |
| 7 | capacitance to control or inhibit sustained arcs |
| 8 | gap |
| 11 | artificial satellite body |
| 12 | load |
| SA | sustained arc |

What is claimed is:

1. A system for controlling a sustained arc on a solar battery array, comprising:
    a plurality of series circuits having solar cells connected in series with one another, the series circuits being connected through a positive line and a negative line to a positive terminal and a negative terminal of a load carried on an artificial satellite to provide a power source;
    wherein capacitances to control the sustained arc are placed between the positive line and the negative line of the series circuit or between preselected series circuits;
    wherein the capacitances are connected in parallel with the positive terminal and the negative terminal,
    wherein the capacitances each have an electrostatic capacity which is determined to an optimal value in a range of from at least 33 of to 10 μF, and wherein the capacitance is charged with a voltage oscillation arising from the sustained arc to prevent a short circuiting between the solar cells, thereby preserving a potential difference between the solar cells, providing a disappeared current fed to the sustained arc, shortening duration of the sustained arc, and eventually leading the sustained arc to extinction.

\* \* \* \* \*